United States Patent

Nakagawa et al.

[11] Patent Number: 5,885,755
[45] Date of Patent: Mar. 23, 1999

[54] DEVELOPING TREATMENT APPARATUS USED IN THE PROCESS FOR MANUFACTURING A SEMICONDUCTOR DEVICE, AND METHOD FOR THE DEVELOPING TREATMENT

[75] Inventors: Seiji Nakagawa; Yasushi Ito, both of Yokohama, Japan

[73] Assignee: Kabushiki Kaisha Toshiba, Kawasaki, Japan

[21] Appl. No.: 69,087

[22] Filed: Apr. 29, 1998

[30] Foreign Application Priority Data

Apr. 30, 1997 [JP] Japan .................................. 9-112451

[51] Int. Cl.$^6$ ....................................................... G03C 5/29
[52] U.S. Cl. ........................ 430/325; 430/294; 430/312; 430/322; 430/323; 430/327
[58] Field of Search ..................................... 430/294, 312, 430/322, 323, 325, 327

[56] References Cited

U.S. PATENT DOCUMENTS 5,474,877 12/1995 Suzuki ..................................... 430/325
5,678,116 10/1997 Sugimoto et al. ...................... 396/627
5,689,749 11/1997 Tanaka et al. .......................... 396/627

Primary Examiner—Hoa Van Le
Attorney, Agent, or Firm—Finnegan, Henderson, Farabow, Garrett & Dunner, L.L.P.

[57] ABSTRACT

A developing treatment apparatus has a spin chuck for supporting a semiconductor wafer on which a photoresist to be developed is formed by suction and rotating it at least two rotating speeds including a low speed and a high speed, a washing liquid supplying nozzle for supplying pure water onto the surface the photoresist, and a developer supplying nozzle for supplying a developer on the same surface. While the semiconductor wafer is supported on the spin chuck by suction and rotated at a low speed, pure water is supplied from the tip of the washing liquid supplying nozzle. Rotating the spin chuck is stopped and supplying the pure water is stopped to form a pure water film having a thickness of several mm on the surface of the photoresist by surface tension, after which for several seconds a developer is sprayed in a mist form from the tip of the developer supplying nozzle and simultaneously the spin chuck is rotated at a high speed to scatter off the pure water on the photoresist gradually, thereby replacing the pure water film on the photoresist with the developer. Subsequently, the spin chuck is rotated at a low speed while the developer is sprayed in a mist form on the surface of the photoresist, thereby stretching and straining the developer, in a liquid form, on the surface of the photoresist and developing the photoresist.

11 Claims, 3 Drawing Sheets

DEVELOPING TREATMENT APPARATUS USED IN THE PROCESS FOR MANUFACTURING A SEMICONDUCTOR DEVICE, AND METHOD FOR THE DEVELOPING TREATMENT

BACKGROUND OF THE INVENTION

The present invention relates to a developing treatment apparatus used in the process for manufacturing a semiconductor device, and a method for the developing treatment, in particular to an apparatus and a method applied to treatment for developing a photoresist which is formed on a semiconductor wafer and has a circuit pattern exposed to light, in a photolithography process.

As is well known, for the process for manufacturing a semiconductor device, a photolithography process is one important technique for forming various circuit patterns in a semiconductor wafer. The photolithography process is in general carried out in the following manner. Namely, a photoresist is coated onto a semiconductor wafer, and then this photoresist is exposed to light by the use of a lithographic apparatus which is referred to as a stepper to transcribe a circuit pattern. Subsequently, the photoresist is developed by an alkaline aqueous solution to obtain a resist pattern corresponding to the transcribed circuit pattern.

The above-mentioned the developing treatment apparatus and the process for the developing treatment, at first a semiconductor wafer to be treated is supported onto a spin chuck by vacuum suction. A photoresist is coated onto the main surface of this wafer and exposed to light by a stepper so that a circuit pattern is transcribed. An alkaline aqueous solution is then supplied from a developer supplying nozzle to the upper surface of the wafer and under the condition that the alkaline aqueous solution is strained and stretched on the surface by surface tension, development is carried out with this wafer being stopped or rotated at a low speed. After that, pure water is supplied from a washing liquid supplying nozzle onto the surface of the wafer to wash it. At the last step, the pure water is scattered off by rotating the wafer at a high speed to dry the surface of the wafer. Thus, a series of the development treatment is finished.

In the prior developing treatment apparatus and the process for the developing treatment as described above, however, the alkaline aqueous solution is jetted out from the developer supplying nozzle disposed to oppose the upper portion of the semiconductor wafer so as to supply the developer to the upper surface of the wafer. Therefore, when much difference in time when the developer starts to be supplied is caused depending on the position at which the pattern is disposed on the surface of the wafer or when scattering of the flowing speed of the developer jetted out from the nozzle occurs, uniform developing treatment cannot be carried out so that a measurement error is liable to be caused in the resist pattern.

Because the surface of the photoresist formed on the semiconductor wafer is highly hydrophobic, the surface is liable to repel the developer at the initial stage of jetting out the developer from the developer supplying nozzle so that turbulent flow of the developer is generated on the surface of the resist and bubbles are produced. The bubbles produced at the interface between the photoresist and the developer are a main cause of bad development and consequently the yield rate of the resist pattern is lowered.

As described above, in the prior developing treatment apparatus and the method for the developing treatment, there remains a problem that it is difficult to supply the developer uniformly on the surface of the photoresist and a measurement error easily occurs in the formed resist pattern. There also remains a problem that bubbles are produced on the surface of the photoresist and consequently the yield rate of the resist pattern is decreased.

BRIEF SUMMARY OF THE INVENTION

Therefore, the first object of the present invention is to provide a developing treatment apparatus making it possible to form a resist pattern having a very small measurement error range and high precision and improve the yield rate of the resist pattern.

The second object of the invention is to provide a method for developing-treatment making it possible to form a resist pattern having a very small measurement error range and high precision and improve the yield rate of the resist pattern.

The first object of the invention can be accomplished by a developing treatment apparatus comprising a liquid film forming means for forming a liquid film on a surface of a photoresist applied to a semiconductor substrate and pattern-exposed to light, and a developer supplying means for replacing the liquid film with a developer and developing the photoresist.

According to the above-mentioned structure, it is possible to reduce difference in developer-supplying time and scattering of the flowing speed of the developer by the liquid film, and prevent production of bubbles at the initial stage of supplying the developer. This makes it possible to supply the developer substantially uniformly onto the whole surface of the photoresist without production of the bubbles at the interface between the photoresist and the developer. Thus, it is possible to form a resist pattern having a very small measurement error range and high precision and improve the yield rate of the resist pattern.

The second object of the invention can be accomplished by a method for developing-treatment, comprising the first step of forming a liquid film on a photoresist applied onto a semiconductor substrate and pattern-exposed to light, and the second step of replacing the liquid film with a developer to develop the photoresist with the developer.

According to the above-mentioned method, it is possible to reduce difference in developer-supplying time and scattering in flow speed of the developer by the liquid film, and prevent production of bubbles at the initial stage of supplying the developer. This makes it possible to supply the developer substantially uniformly onto the whole surface of the photoresist without producing the bubbles at the interface between the photoresist and the developer. Thus, it is possible to form a resist pattern having a very small measurement error range and high precision and improve the yield rate of the resist pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
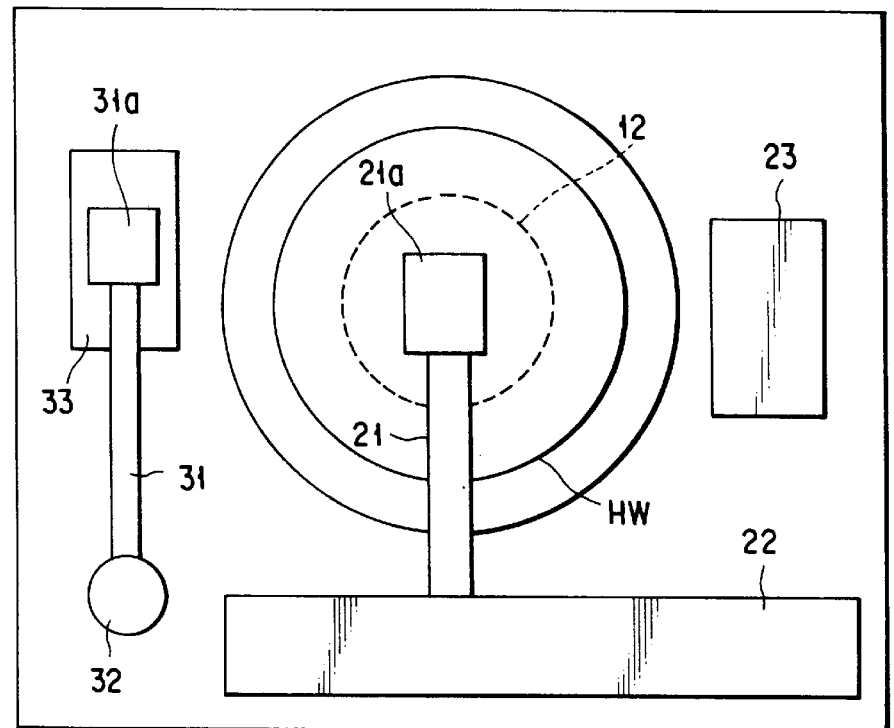
FIG. 1 is a schematic plan view illustrating a structural example of a developing treatment apparatus according to the first embodiment of the present invention.

FIG. 1 is a plan view illustrating a schematic structure of a developing treatment apparatus according to the first embodiment of the present invention. The developing treatment apparatus has a spin chuck 12 in the substantially central portion of its body 11. The spin chuck 12 can rotatably hold a semiconductor wafer (semiconductor substrate) HW, which is an object to be treated, by vacuum suction. The body 11 of the apparatus has within it a developer supplying nozzle 21 for supplying a developer onto the surface of the semiconductor wafer HW and a washing liquid supplying nozzle 31 for supplying a washing liquid onto the same surface. The washing liquid supplying nozzle 31 is used not only for supplying the washing liquid (pure water) onto the surface of the semiconductor wafer, but also for forming a liquid film (a pure water film) onto the same surface. If necessary, to the developer supplying nozzle 21 and the washing liquid supplying nozzle, moving mechanisms (a developer nozzle driving member 22 and a washing liquid nozzle driving member 32) may be respectively provided for moving the respective nozzles over the spin chuck 12. The tip portion 21a of the developer supplying nozzle 21 is taken out from a developer nozzle storing member 23 with the developer nozzle driving member 22, in the developing step, so that the tip portion 21a can be moved over the substantially central portion of the spin chuck 12. The tip portion 31a of the washing liquid supplying nozzle 31 is taken out from a washing liquid storing member 33 with the washing liquid nozzle driving member 32, in the washing step and the pretreating step for development, so that the tip portion 31a can be moved over the substantially central portion of the spin chuck 12.

FIGS. 2A to 2G are respectively for explaining the method for developing-treatment used in the developing treatment apparatus illustrated in FIG. 1, and side views illustrating the steps of the developing treatment in turn.

In the case of carrying out the developing treatment, the semiconductor wafer HW is firstly put on the spin chuck 12 in the body 11 of the apparatus, and is held on it by vacuum suction. A photoresist is applied onto the semiconductor wafer HW by a well-known process and then the photoresist is exposed to light by a stepper to transcribe a circuit pattern on the photoresist. The spin chuck 12 is rotated at a low speed of several tens rpm and the tip portion 31a of the washing liquid supplying nozzle 31 is moved over the substantially central portion of the semiconductor wafer HW. Under this condition, pure water PW is jetted out from the tip portion 31a, as pretreatment of the development (see FIG. 2A)

Figure 2A:
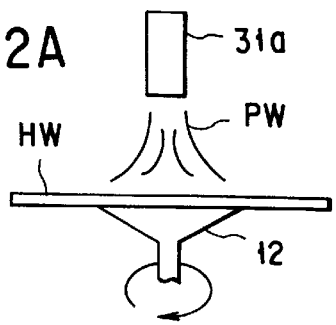
FIGS. 2A to 2G are respectively for explaining the method for developing-treatment used in the developing treatment apparatus illustrated in FIG. 1, and side views illustrating the steps of the developing treatment in turn.
Figure 2B:
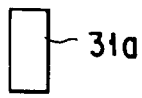

In the following step, rotating the spin chuck 12 is stopped and supplying pure water PW is stopped from the tip portion 31a of the washing liquid supplying nozzle 31, thereby forming a pure water film (a liquid film) PWF having a thickness of several millimeters on the surface of the photoresist applied onto the semiconductor wafer HW by surface tension (see FIG. 2B).

After that, the washing liquid supplying nozzle 31 is moved away from the position over the spin chuck 12 to put the tip portion 31a thereof into the washing liquid nozzle storing member 33, and the tip portion 21a of the developer supplying nozzle 21 is moved over the substantially central portion of the semiconductor wafer HW.

Figure 2C:
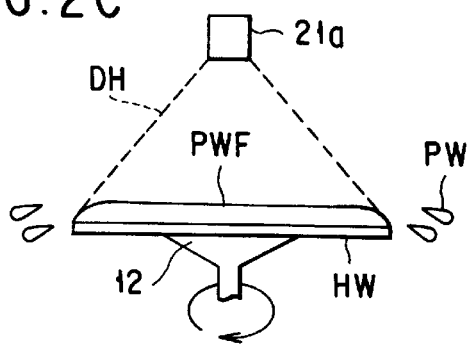

Subsequently, a developer (for example, tetramethyl ammonium hydroxide having a concentration of 2.38% by weight) DH from the tip portion 21a of the developer supplying nozzle 21 is sprayed in a mist form onto the surface of the pure water film PWF and simultaneously the semiconductor wafer HW is rotated at a high speed of several thousands rpm with the spin chuck 12 to scatter off pure water PW gradually (see FIG. 2C).

Figure 2D:
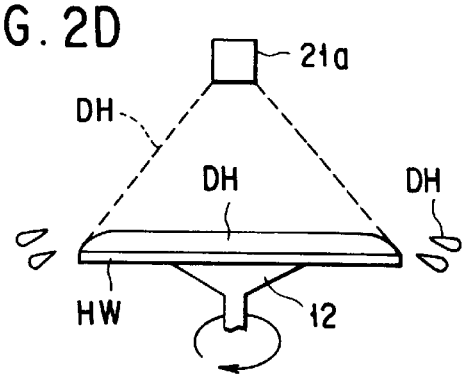

When several seconds pass in the above manner, the pure water film PWF formed on the surface of the photoresist is replaced with the developer DH (see FIG. 2D).

Figure 2E:
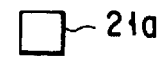
Figure 2E:
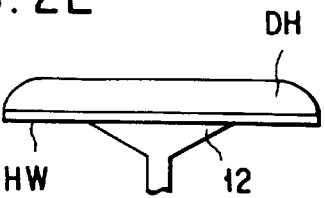

Thereafter, while the semiconductor wafer HW is rotated at a low speed of several tens rpm with the spin chuck 12, the developer DH from the tip portion 21a of the developer supplying nozzle 21 is sprayed in a mist form for several seconds. This permits the developer DH to be stretched and strained, in a liquid form, on the surface of the photoresist on the semiconductor wafer HW so that the developing treatment can be carried out (FIG. 2E).

Subsequently, the developer supplying nozzle 21 is moved away from the position over the spin chuck 12 to put the tip portion 21a thereof into the developer nozzle storing member 23, and the tip portion 31a of the washing liquid nozzle 31 is moved over the substantially central portion of the semiconductor wafer HW.

Figure 2F:
Figure 2F:
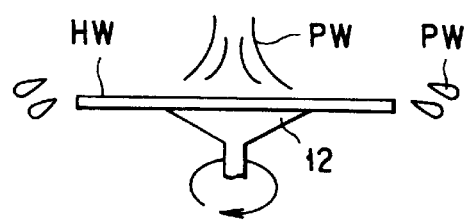
Figure 2G:
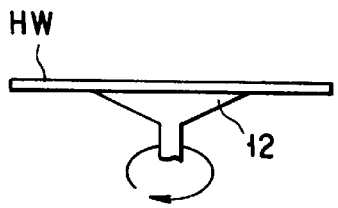

The semiconductor wafer HW subjected to the developing treatment is rotated at a low speed of several tens rpm with the spin chuck 12 and pure water PW is jetted out from the tip portion 31a of the washing liquid supplying nozzle 31, so that the surface of the semiconductor wafer HW is washed (FIG. 2F).

When the washing treatment is finished, supplying the pure water PW is stopped and the tip portion 31a of the washing liquid supplying nozzle 31 is put into the washing liquid nozzle storing member 33. The spin chuck 12 is rotated at a high speed of several thousands rpm to scatter off pure water. Thus, the semiconductor wafer HW is dried (see FIG. 2G).

In the above-mentioned manner, the photoresist which is pattern-exposed to light is developed to form a desired resist-pattern. Thus, a series of the developing treatment is finished.

According to the above-mentioned developing treatment apparatus and the method for the treatment, the pure water film PWF is present on the surface of the photoresist to which the developer DH is supplied and this pure water film PWF functions as a buffer. Even if the surface of the photoresist is highly hydrophobic, therefore, it is possible to prevent the developer DH from being repelled on the surface of the photoresist and production of bubbles resulting from the phenomenon that the developer falls in a turbulent flow state on the surface of the resist, at the initial stage of jetting out the developer DH. Thus, bad development can be prevented. Since the developer DH is sprayed in a mist form on the surface of the pure water film PWF, it is possible to supply the developer substantially uniformly to the whole surface of the photoresist and reduce difference in time at which the developer DH is supplied onto the surface of the wafer HW. Thus, scattering of the flowing speed for supplying the developer DH can be reduced. As a result, it is possible to form a resist pattern having a very small measurement error range and high precision and improve the yield rate of the resist pattern.

Furthermore, it is not necessary to apply special alternation to a common developing treatment apparatus, since the pure water film is formed by use of washing-pure water, which is generally held in such a apparatus. Thus, a rise in cost for applying the present invention can be minimized.

The above-mentioned first embodiment of the invention was explained referring to an example in which pure water is used to form a liquid film which functions as a buffer. However, the above-mentioned advantageous effects can also be obtained by using an aqueous solution containing, for example, any one of an organic ammonium hydroxide such as TMAH or choline, a metal hydroxide such as NaOH, KOH or $Ca(OH)_2$, an alcohol such as methyl alcohol or ethyl alcohol, an amine such as trimethylamine, and a surfactant to form a liquid film.

Figure 3:
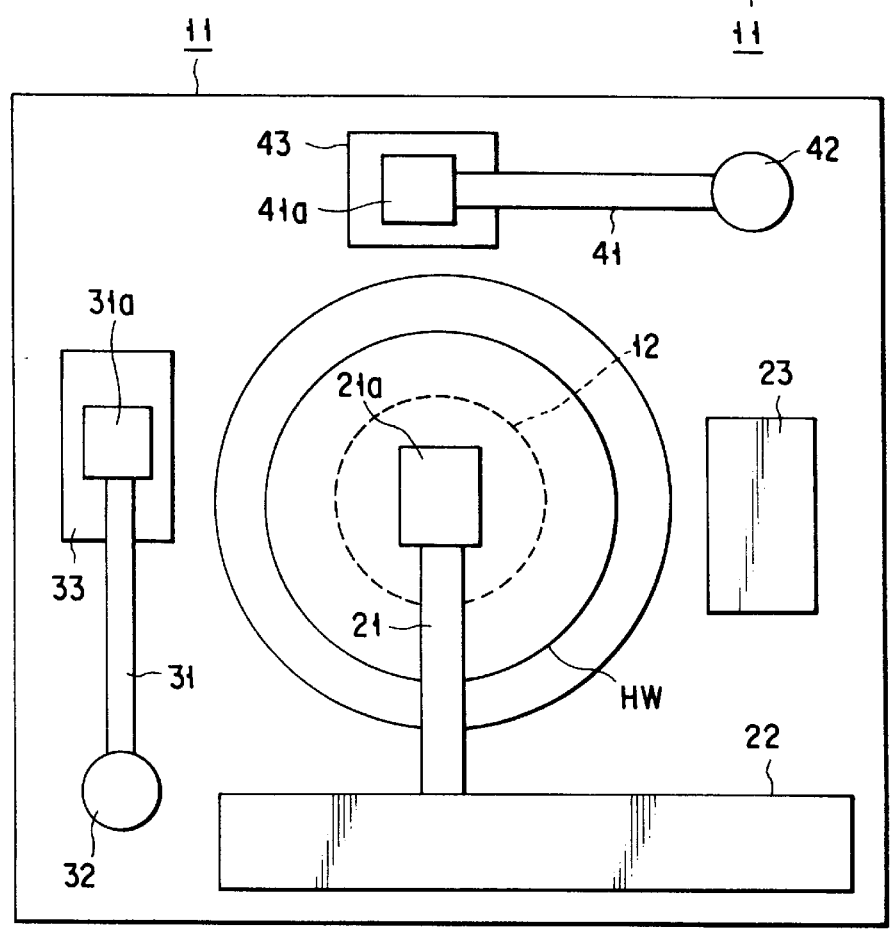
FIG. 3 is a schematic plan view illustrating a structural example of a developing treatment apparatus according to the second embodiment of the present invention.

In this case, for example an exclusive nozzle 41 only for forming a liquid film from which the above-mentioned aqueous solution can be supplied should be added to the body 11 of the apparatus, as shown in FIG. 3. In FIG. 3, the same reference numbers as in FIG. 1 are attached to the common members in both of the figures. Thus, the explanation thereof is omitted. In the developing treatment apparatus according to the second embodiment, a tip portion 41a of the nozzle 41 is taken out from a nozzle storing member 43 with a nozzle driving member 42 and is moved over the substantially central portion of the spin chuck 12, in the pretreatment for development. The above-mentioned aqueous solution is supplied onto the surface of the photoresist to form a film of the aqueous solution. Other steps are the same as in the first embodiment.

When the aqueous solution containing an alcohol, an amine or a surfactant, which has smaller surface tension than pure water, is used to form a liquid film, time necessary for formation of the liquid film becomes shorter. Therefore, the advantage of improvement in throughput can be obtained, as well as the same advantage as obtained by the first embodiment.

Figure 4A:
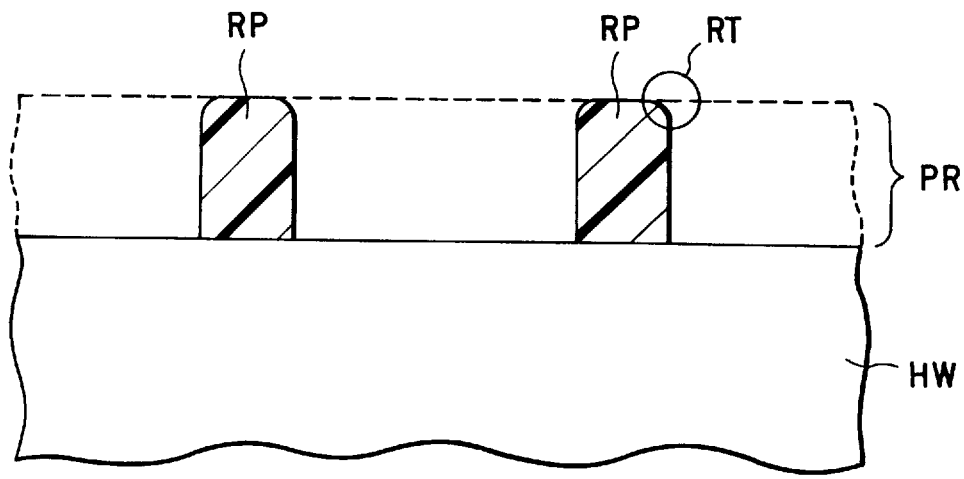
FIGS. 4A and 4B are respectively sectional views of a semiconductor wafer in the case of using an alkaline aqueous solution to form an aqueous solution film on the surface of a photoresist.

In the case of using an alkaline aqueous solution such as organic ammonia hydroxide or metal hydroxide to form a liquid film, it is possible to change the concentration of the developer. Therefore, it becomes possible to control the developing speed at the initial stage of developing the photoresist. As a result, the advantages of improvement in the shape of the resist pattern and dissolution can be obtained, as well as the same advantage as obtained by the first embodiment. Specifically, for such a photoresist PR that the upper portion RT of its resist pattern RP is developed by the developer DH, dissolution speed is made small at the initial stage of the development in the case of using an alkaline solution having a lower concentration (2.38 or less % by weight) than that of the developer DH to form a liquid film, as shown in, for example, FIG. 4A. Thus, it is possible to prevent film-reduction in the upper portion RT of the pattern RP of the resist PR. This makes it possible to form the resist pattern RP whose edge is more perpendicular to the main surface of the semiconductor wafer WH, thereby improving dissolution of the resist pattern RP.

Figure 4B:
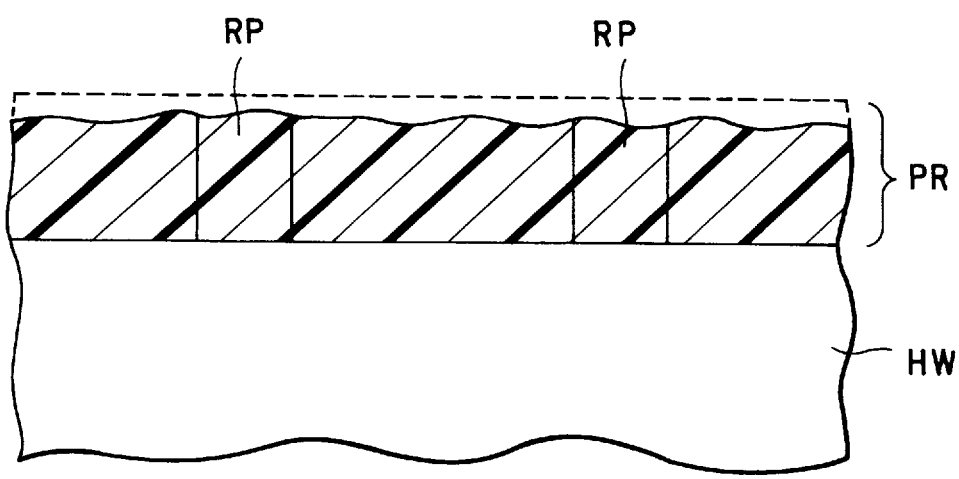

On the contrary, for such a photoresist PR that on its surface a relatively large amount of a non-soluble film or a difficultly-soluble film is liable to be produced, this non-soluble film or difficultly-soluble film can be removed off by developing the whole surface of the photoresist PR at the initial stage of the development, in the case of using an alkaline aqueous solution having a higher concentration (about twice as high as 2.38% by weight) than that of the developer DH to form a liquid film, as shown in, for example, FIG. 4B.

The present invention is not limited to the first and the second embodiments, and can be carried out in various forms within the scope claimed in claims.

As described above in detail, the present invention provides a developing treatment apparatus and a method for the developing treatment making it possible to form a resist pattern having a very small measurement error range and high precision and improve the yield rate of the resist pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for developing-treatment, comprising the steps of:

the first step of forming a liquid film on a surface of a photoresist applied onto a semiconductor substrate and pattern-exposed to light; and the second step of replacing the liquid film with a developer to develop the photoresist with the developer.

2. A method for developing-treatment according to claim 1, wherein in the first step the liquid film is formed of pure water for washing the semiconductor substrate.

3. A method for developing-treatment according to claim 1, wherein in the first step the liquid film is formed of an aqueous solution containing at least one selected from the group consisting of organic ammonium hydroxide, metal hydroxide, alcohols, amines and surfactants.

4. A method for developing-treatment comprising the steps of:

rotating a semiconductor wafer at a low speed and simultaneously supplying pure water onto a surface of a photoresist on the semiconductor;

stopping rotating the semiconductor wafer and stopping supplying the pure water to form a pure water film on the surface of the photoresist by surface tension;

spraying a developer in a mist form on the surface of the pure water film and simultaneously rotating the semiconductor wafer at a high speed to scatter off the pure water gradually, thereby replacing the pure water film formed on the surface of the photoresist with the developer;

rotating the semiconductor wafer at a low speed while spraying the developer in a mist form on the surface of the photoresist to strain and stretch the developer, in a liquid form, on the surface of the photoresist, thereby developing the photoresist;

supplying pure water onto the surface of the semiconductor wafer to wash it; and rotating the semiconductor wafer at a high speed to scatter off the pure water, thereby drying the semiconductor wafer.

5. A method for developing-treatment comprising the steps of:

rotating a semiconductor wafer at a low speed and simultaneously supplying a surface of a photoresist on the semiconductor an aqueous solution containing at least one selected from the group of organic ammonium hydroxide, metal hydroxide, alcohols, and amines and surfactants;

stopping rotating the semiconductor wafer and stopping supplying the aqueous solution to form an aqueous solution film on the surface of the photoresist by surface tension;

spraying a developer in a mist form on the surface of the aqueous solution film and simultaneously rotating the semiconductor wafer at a high speed to scatter off the aqueous solution, thereby replacing the aqueous solution film formed on the surface of the photoresist with the developer;

rotating the semiconductor wafer at a low speed while spraying the developer in a mist form on the surface of the photoresist to strain and stretch the developer, in a liquid form, on the surface of the photoresist, thereby developing the photoresist;

supplying pure water onto the surface of the semiconductor wafer to wash it; and rotating the semiconductor wafer at a high speed to scatter off the pure water, thereby drying the semiconductor wafer.

6. A method for manufacturing a semiconductor device comprising the steps of:

applying a photoresist onto a semiconductor wafer;

exposing the photoresist to light so as to transcribe a circuit pattern;

rotating the semiconductor wafer at a low speed while supplying pure water onto a surface of the photoresist;

stopping rotating the semiconductor wafer and stopping supplying the pure water to form a pure water film on the surface of the photoresist by surface tension;

spraying a developer in a mist form on the surface of the pure water film and simultaneously rotating the semiconductor wafer at a high speed to scatter off the pure water gradually, thereby replacing the water film formed on the surface of the photoresist with the developer; and rotating the semiconductor wafer at a low speed while spraying the developer in a mist form on the surface of the photoresist to strain and stretch the developer, in a liquid form, on the surface of the photoresist, thereby developing the photoresist.

7. A method for manufacturing a semiconductor device according to claim 6, which further comprises, after the step including developing the photoresist, the step of supplying pure water onto the surface of the semiconductor wafer to wash it.

8. A method for manufacturing a semiconductor device according to claim 7, which further comprises, after the step of supplying pure water onto the surface of the semiconductor wafer to wash it, the step of rotating the semiconductor wafer at a high speed to scatter off the pure water, thereby drying the semiconductor wafer.

9. A method for manufacturing a semiconductor device comprising the steps of:

applying a photoresist onto a semiconductor wafer;

exposing the photoresist to light so as to transcribe a circuit pattern;

rotating the semiconductor wafer at a low speed while supplying a surface of the photoresist an aqueous solution containing at least one selected from the group consisting of organic ammonium hydroxide, metal hydroxide, alcohols, and amines and surfactants;

stopping rotating the semiconductor wafer and stopping supplying the aqueous solution to form an aqueous solution film on the surface of the photoresist by surface tension;

spraying a developer in a mist form on the surface of the aqueous solution film and simultaneously rotating the semiconductor wafer at a high speed to scatter off the aqueous solution gradually, thereby replacing the aqueous solution film formed on the surface of the photoresist with the developer; and rotating the semiconductor wafer at a low speed while spraying the developer in a mist form on the surface of the photoresist to strain and stretch the developer, in a liquid form, on the surface of the photoresist, thereby developing the photoresist.

10. A method for manufacturing a semiconductor device according to claim 9, which further comprises, after the step including developing the photoresist, the step of supplying pure water onto the surface of the semiconductor wafer to wash it.

11. A method for manufacturing a semiconductor device according to claim 10, which further comprises, after the step of supplying pure water onto the surface of the semiconductor wafer to wash it, the step of rotating the semiconductor wafer at a high speed to scatter off the pure water, thereby drying the semiconductor wafer.

* * * * *